United States Patent [19]

Gottlieb et al.

[11] Patent Number: 4,491,895

[45] Date of Patent: Jan. 1, 1985

[54] DECOUPLING CAPACITOR AND METHOD OF MANUFACTURE THEREOF

[75] Inventors: Michael M. Gottlieb, Kraainem, Belgium; David S. Fishman, West Hartford, Conn.

[73] Assignee: Rogers Corporation, Rogers, Conn.

[21] Appl. No.: 551,465

[22] Filed: Nov. 14, 1983

[51] Int. Cl.³ .................. H01G 1/14; H01G 7/00; H01B 7/00

[52] U.S. Cl. .................. 361/306; 29/25.42; 174/72 B

[58] Field of Search .............. 174/72 B; 29/25.42; 361/306, 321, 322, 392, 393, 402, 404, 433, 328

[56] References Cited

U.S. PATENT DOCUMENTS 3,550,228 12/1970 Asscher .................. 29/25.42
3,588,629 6/1971 Millard et al. .................. 361/433
3,880,493 4/1975 Lockhart .................. 339/147 R
4,266,091 5/1981 Fukuda .................. 174/72 B
4,356,532 10/1982 Donaher et al. .................. 361/393
4,394,713 7/1983 Yoshida .................. 361/433

FOREIGN PATENT DOCUMENTS 5141864 10/1974 Japan .
20556 2/1983 Japan .

Primary Examiner—Donald Griffin
Attorney, Agent, or Firm—Fishman & Dionne

[57] ABSTRACT

A decoupling capacitor and method of manufacture thereof are presented wherein the decoupling capacitor is formed in an in-line assembly and insert molding process. The decoupling capacitor is a hermetically sealed capacitive unit consisting of a ceramic chip, active leads and molded lugs for auto-insertion into printed circuit boards. The active leads and molded lugs are on the same height level to promote symmetry and ease of handling.

33 Claims, 5 Drawing Figures

DECOUPLING CAPACITOR AND METHOD OF MANUFACTURE THEREOF

BACKGROUND OF THE INVENTION

This invention relates to the field of decoupling capacitors for integrated circuits. More particularly, this invention relates to novel and improved decoupling capacitors, and methods of formation thereof wherein the capacitors are formed in an automated process of in-line assembly and insert molding to form decoupling capacitors which are auto-insertable into printed circuit boards for use in conjunction with dual-in-line integrated circuits or other electronic components.

U.S. patent application Ser. No. 403,408 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two capacitor leads have been inserted.

The diagonally located leads or pins on the decoupling capacitor of application Ser. No. 403,408 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent terminal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior application Ser. No. 403,408 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

A need also exists for a decoupling capacitor structure which is both auto-insertable, hermetically sealed, and capable of being manufactured by automated assembly processes.

Another problem in many of the prior art configurations is related to the size constraints imposed on the decoupling capacitor system by the intended end use of the capacitor beneath an IC on a printed circuit board. These capacitors typically include a ceramic capacitor chip (a ceramic body with opposed conductive face surfaces), a pair of conductive plates abutting the face surface of the chip with an active pin extending from each plate, and an insulating outer covering or case. In particular, the thickness or height dimension is limited to about 0.038 to 0.040 inch. In the prior art, since the ceramic capacitor chip is about 0.009 to 0.010 inch thick and each conductive plate is about 0.007 inch thick, only about 0.007 to 0.0085 inch per side remains available for encapsulation or other covering by an insulated casing. Because of manufacturing tolerances, the insulating cover may be breached, thus leading to problems of contamination, short circuiting, etc.

U.S. patent application Ser. No. 456,654 (assigned to the assignee hereof) discloses one approach to solving the above discussed auto-insertion problem by the incorporation of dummy or stabilizing pins in a decoupling capacitor assembly. U.S. patent application Ser. No. 551,566 of Watson for "Decoupling Capacitor and Method of Manufacture Thereof" and U.S. patent application Ser. No. 552,107 for "Improved Decoupling Capacitor" of David S. Fishman, both of which are being filed simultaneously herewith and are assigned to the assignee hereof present other constructions of and methods for forming decoupling capacitors with dummy pins or molded stabilizing lugs. The present invention presents other constructions of and methods for forming improved decoupling capacitors which are hermetically sealed, auto-insertable and manufactured in an automated process of in-line assembly and insert molding, particularly constructions in which the active leads or pins and the molded lugs are on the same level of the unit.

SUMMARY OF THE INVENTION

The above discussed and other problems of the prior art are overcome or substantially reduced by the new and improved decoupling capacitor of the present invention. Also, several additional advantages in design, assembly, cost and quality are realized with the present invention.

In accordance with the present invention, a subassembly of the decoupling capacitor is formed in an automated, in-line assembly process; and the subassembly is then employed as an insert in an insert molding process to form a hermetically sealed decoupling capacitor.

The in-line assembly process of the present invention results in high speed automated construction of a subassembly for the decoupling capacitor. The subassembly consists of the capacitive ceramic chip and active leads sandwiched between and bonded to two layers of a film. The film is an insulating material which has conductive areas thereon to connect one active lead to one face of the capacitor chip and the other active lead to the other face of the capacitor chip. This subassembly is employed as an insert in an insert molding process to produce the final hermetically sealed decoupling capacitor which has dummy lugs integrally formed in the molded housing for auto-insertion purposes. The subassembly is formed in an in-line strip process employing a continuous band of a suitable metal alloy and two layers of the film. Connection plates and active leads are punched in the metal band or strip; the capacitive chips and the connector plates are tacked and bonded to the support films to form the subassembly; and the subassembly is then insert molded.

The assembly process may be carried out in a continuous process or in a series of discontinuous groups of steps. Also, a strip of subassemblies may be used as inserts in a multi-station transfer mold, whereby a plurality of the decoupling capacitors may be formed in each insert molding step.

In addition to solving the misalignment problem and being suitable for auto-insertion, the decoupling capacitor of the present invention and the process of formation thereof have several other advantages and potentials. The decoupling capacitor of the present invention is hermetically sealed in the insert molding step, thereby sealing the capacitor elements from environmental hazards. The process of the present invention is particularly suitable for high speed production of the decoupling capacitors in large quantities, with a minimum number of components being required to make the product, and this process presents opportunities for reduced costs along with overall improvement in quality.

Another feature and advantage of the present invention is that the terminal pins project from the sides of the body at approximately the same height or level even though being electrically connected to opposite sides or faces of the capacitor. This feature enhances the uniformity and symmetry of the product and may contribute to increased stability in handling during auto-insertion.

Another feature and advantage of the present invention is that increased thickness may be available for the protective encapsulation.

The above discussed and other advantages of the present invention will be apparent to and understood by those skilled in the art from the following detailed description and drawings.

BRIEF DESCRIPTION OF THE DRAWINGS

Referring now to the several FIGURES of the drawings, wherein like elements are numbered alike in the several FIGURES.

DESCRIPTION OF THE PREFERRED EMBODIMENTS

Figure 1:
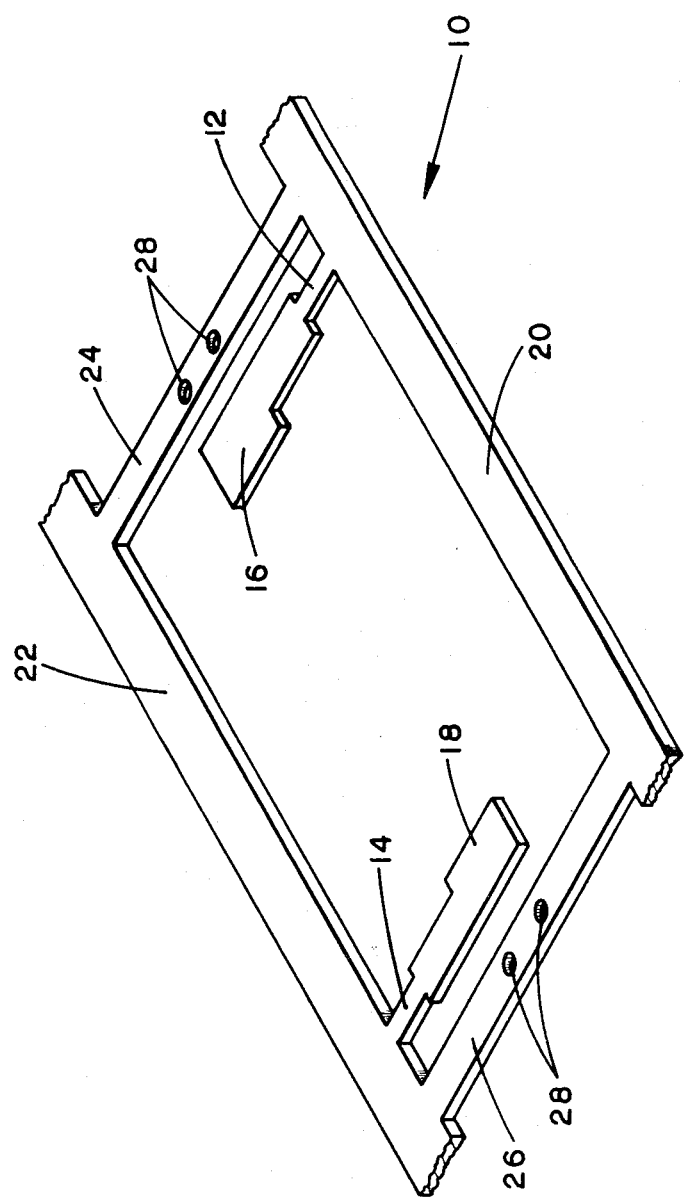
FIG. 1 is a perspective view of a first stage of subassembly components and construction of the capacitive element in accordance with the present invention.
Figure 5:
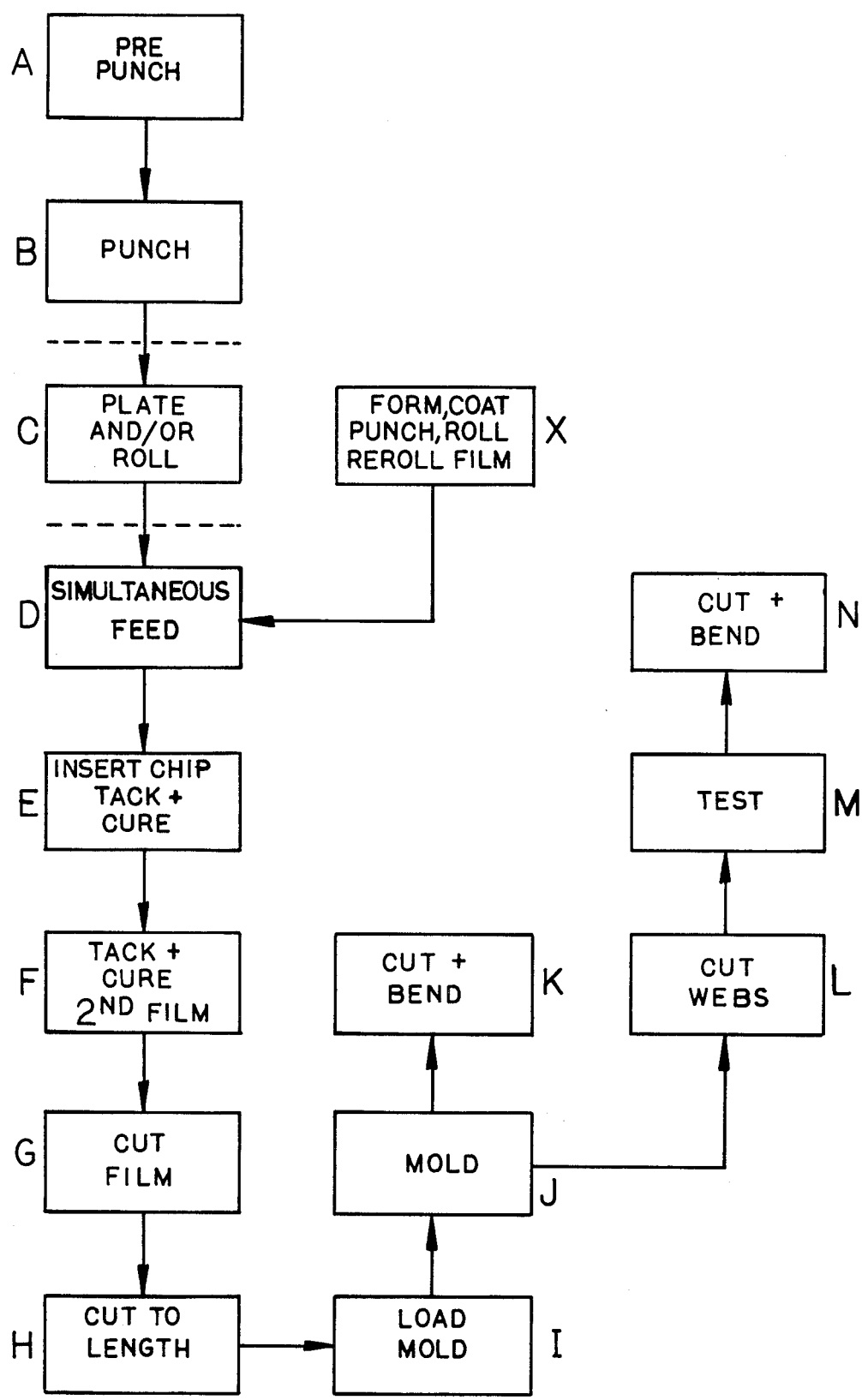
FIG. 5 is a block flow diagram of the manufacturing process in accordance with the present invention.

Referring to a joint consideration of FIGS. 1 and 5, subassembly components are punched from a continuous strip or band of metal, such as copper alloy, of about 0.25 mm (0.010 inch) thick and of suitable width for the requirements of the component being made. A portion of the continuous copper band is shown in FIG. 1 after various punching steps have been performed to form a band of windows 10 which in their open interiors have the basic form of contact pins 12 and 14 and connection plates 16 and 18. The exterior or perimeter of each window 10 is made up of a pair of edge strips 20 and 22 and transverse connecting webs 24 and 26 which remain after the punching operations have taken place to form the structure within the windows.

The structure of FIG. 1 is formed from the continuous band of copper in a series of process steps indicated as steps A and B in FIG. 5. In step A, a preliminary punching step is performed whereby relief holes or windows are punched to remove parts of the unwanted areas from within the interior of the window frame. The strip of material then advances to the next stage of the punching tool wherein material is removed to form the array of terminal contact pins 12 and 14 and connection plates 16 and 18 within the window as shown in FIG. 1 in process step B. In this process step B, locating or alignment holes 28 are also punched into the continuous copper band for alignment and registration purposes in further process steps.

It will be noted that the tooling which accomplishes the punching can be so designed that the distance between the center of the terminal pins 12 and 14 and the size of the connection plates 16 and 18 may be varied to accommodate a range of center-to-center distances for the connecting pins and connecting plate sizes in the final product.

Following process step B, the copper band is passed through a tin plating operation so that all metal surfaces are suitably plated. This plating is indicated as process step C in FIG. 5. The plating may be accomplished in a continuous operation immediately following punching step B, or the copper strip may be rewound after punching step B and plated at a subsequent time. Also, either before or after plating step C, the copper strip may be rewound and stored for future use, or it may continue on to the further processing steps of step D, et seq. The fact that step C may be carried out as a continuous part of the process or as an interrupted part of the process is indicated by the dashed lines between steps B and D.

In a separate operation, a thin insulating film 27 (e.g., 50 to 75 thick DuPont Mylar) is coated with a very thin (e.g., 5 thick) heat activated semi-crosslinkable nonconductive adhesive 31, which, after coating will exhibit no tack. This film is originally at least twice the width of a film layer 27 shown in FIG. 2. This film is then punched with registration holes 29, 29' to coordinate with the registration holes 28 in the copper strip. After the registration holes are punched in the film 27, the roll of film is passed through a silk screen operation in which bands of electrically conductive adhesive 33 (indicated by the darker or stippled area of FIG. 2) are printed across the width of the film at a location offset between successive sets of registration holes 35, 37. The conductive adhesive is then heat cured. The insulating film 30 is then slit to form films 27 and 27' with conductive areas 33 and 33', respectively. The films are then wound into rolls to be played out, with adhesive surface facing each other, in conjunction with further processing of the copper strip. One of the rolls of film which will dispense the film strip 27' of FIG. 2 must be rewound so that the registration holes 35 and 37 of film 27 will be aligned with the holes 37' and 35', respectively, of film 27'. The forming, adhesive coating, registration punching, slitting, rolling and rerolling of film 27 and 27' is indicated at step X.

Figure 2:
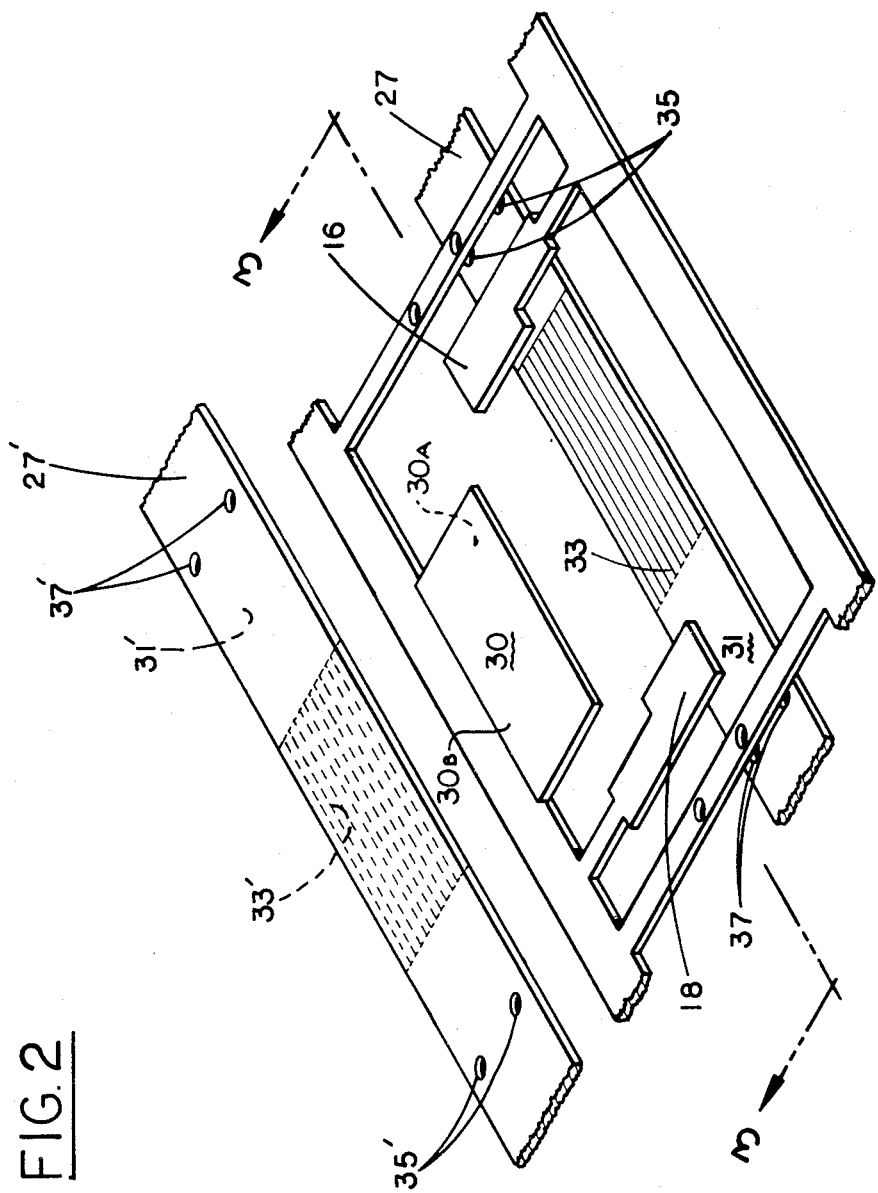
FIG. 2 is a perspective view of a second stage of subassembly components and construction of the capacitive element in accordance with the present invention.

Referring now to FIGS. 2 and 5, the punched copper strip and the films 27, 27' simultaneously are fed into an assembly line with the copper strip sandwiched between the film layers 27, 27'. The assembly line has an advancing system which picks up and registers with both the locating holes 28 in the window frame of the strip and the registration holes 35, 37 and 37', 35' in insulating strip 27, 27'. The connecting plate 16 is brought into contact with the electrically conductive adhesive coated surface 33 of the film 27, and connecting plate 18 is brought into contact with nonconductive adhesive area 31 on film 27. At this time film 27' is spaced above the copper band. This simultaneous feed or advancement of the punched copper band and film strips 27, 27' is indicated at step D in FIG. 5.

At the first stage in the assembly line, the punched copper band and film strips are stopped, and, in step E, a capacitive chip 30 is placed on the conductive adhesive surface 33 of film strip 27 between the connection plates 16 and 18. Capacitor chip 30 has conductive face surfaces 30a and 30b formed thereon, and this chip 30 is placed on film 27 so that most of the lower face surface 30a of chip 30 overlies and contacts conductive adhesive 31, while a small portion will contact nonconductive adhesive 33. The length of the band of conductive adhesive 33 is slightly less than the combined length of connector plate 16 and chip 30. Similarly, the length of conductive band 33' is slightly less than the combined length of connector plate 18 and chip 30. Chip 30 and connection plates 16 and 18 are then heat tacked to film 27 in this step E.

The combination is then advanced to the next station of the assembly process where, in step F, the upper film 27' is brought into contact with and heat tacked to the upper surface of chip 30 and to connection plates 16 and 18 so that the assembly can be easily handled in subsequent operations. Due to the registration holes and the offset location of conductive adhesive area 33', the conductive adhesive 33' contacts connection plate 18 and the conductive upper face surface of chip 30, while the nonconductive adhesive area 31' of film 27' contacts conductive plate 16. Thus as the result of step F, most of upper face surface 30b is under and constructs conductive adhesive 33', while a small portion contacts nonconductive adhesive 31'; connection plate 18 contacts conductive adhesive 33', and connection plate 16 contacts nonconductive adhesive 31'.

The capacitive chip inserted into the assembly in step E may, conveniently, be stored in a dispensing magazine for sequential insertion into the assembly. The capacitive chips are formed in a separate operation and consist of a ceramic capacitor element, such as barium titinate in the form of a flat generally rectangular plate, with opposed conductive flat face surfaces or plates formed on opposing faces of the plate. Preferably, the face surfaces of the ceramic chip are coated with nickel or nickel alloy in accordance with U.S. patent application Ser. No. 391,967 which is assigned to the assignee hereof and the entire contents of which are incorporated herein by reference.

Figure 3:
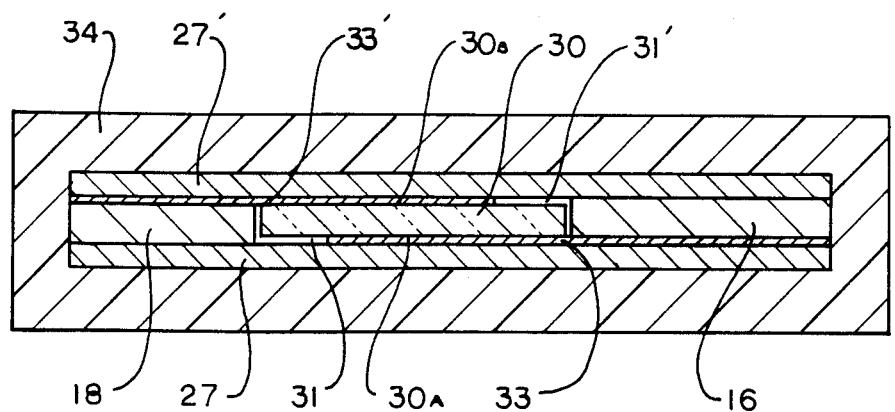
FIG. 3 is a cross-sectional elevation view through a completed subassembly unit in accordance with the embodiment of FIGS. 1 and 2.

Thus, the lower face surface 30a of chip 30 is in electrical contact with connection plate 16 and the upper face surface 30b of chip 30 is in electrical contact with connection plate 18. As best seen in FIG. 3, connection plates 16 and 18 are spaced from the ends of chip 30 (to prevent electrical contact between plate 16 and conductive face surface 30b and between plate 18 and conductive face surface 30a). Insulation may be included in these spaces between the ends of chip 30 and the connection plates.

The combination is then advanced to the next station where, in step G, the parts of insulating film 27, 27' between the connection plate 16 and web 24 and between connection plate 18 and web 26 are punched out and removed.

Each assembly of a pair of terminal pins 12 and 14 and a pair of connection plates 16 and 18 and the length of film strips 27, 27' bonded to a capacitor chip 30 and to the connection plates constitutes a subassembly of a decoupling capacitor of the present invention. At this stage in the processing, each subassembly is still attached to the side rails 20 and 22 of the original copper band, and the connecting webs 24 and 26 are still in place.

The band of material then advances to the next station in the assembly operation where the band, in step H, is cut into lengths comprising a desired number of subassemblies in each length. These lengths of subassembly units may then be stored for future use or may be moved directly to further processing steps for insert molding in accordance with the present invention. Once again, the dashed line in the flow diagram following step H indicates that the strips or lengths of subassemblies may be stored for further processing or may pass directly to the further processing steps.

The strip or length of connected subassemblies is next transferred to and charged, in step I, into an appropriately designed multi-station transfer mold (with the number of stations in the mold equalling the number of subassemblies on the strip). Each subassembly constitutes an insert for one station in the transfer mold. The mold is then closed, and in step J, the subassembly is then encapsulated as a molded insert in a suitably selected low pressure epoxy transfer molded plastic. In step J, the entire subassembly of capacitor 30, plates 16 and 18 and terminal pins 12 and 14 is encapsulated with the exception of that portion of pins 12 and 14 which is shown bent down and exposed in FIG. 4 to form a plurality of encapsulated decoupling capacitors as shown in FIG. 4.

Figure 4:
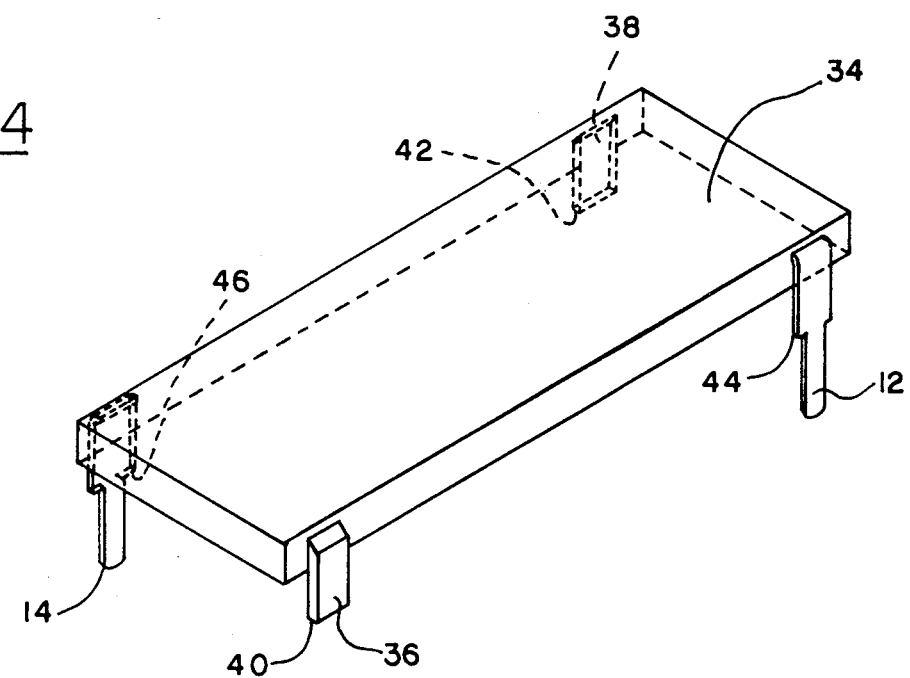
FIG. 4 is a perspective view of a completed decoupling capacitor in accordance with the present invention.

In the next step of the manufacturing process, the strip of molded decoupling capacitor packages is removed from the transfer mold and passed through a suitable punch or cutting tool which, in step M, severs the ends of pins 12 and 14 from edge strips 20 and 22 and bends pins 12 and 14 downwardly from the horizontal position as shown in FIG. 2 to the vertical position shown in FIG. 4. This step separates the individual decoupling capacitors from the strip as a finished product, and the finished product is then ready for testing, marking, burn-in and packaging for storage or shipment.

As an alternative to step K, the transverse webs 24 and 26 may be severed in step L, thus leaving the capacitor elements still connected to edge strips 20 and 22. It is then possible to gang-test, mark and burn-in the capacitors in this strip array in step M, and thereafter sever the pins 12 and 14 from the edge strips 20 and 22 and bend the pins in step O, which corresponds to step N.

As seen in FIG. 4, the final product after molding and severing consists of the encapsulated subassembly, previously described, encapsulated within a plastic outer housing 34. Plastic housing 34 contains integrally molded lugs 36 and 38 which are formed during the molding of package 34 as a result of appropriate recesses in the mold cavity. The final overall shape of the decoupling capacitor is generally rectangular, as shown in FIG. 4. Terminal pins 12 and 14 are located at one pair of diagonally opposite corners of the rectangular structure, and lugs 36 and 38 are located at the other pair of diagonally opposite corners of the unit. Lugs 36 and 38 constitute stablizing surfaces which provide the necessary symmetry to the assembly for the unit to be gripped by the jaws of an automatic insertion machine for automatic insertion into a printed circuit board. Lugs 36 and 38 are formed so that their exterior contours are the same as the contours of pins 12 and 14 after the pins have been bent. In addition, the bottom surfaces 40 and 42 of the lugs are at the same level as shoulders 44 and 46 on pins 12 and 14. Shoulders 44 and 46 on the terminal pins and the bottom surfaces 40 and 42 of the stablizing lugs cooperate to hold the decoupling capacitor package slightly off the printed circuit board on which it is mounted and absolutely parallel thereto for appropriate cooling and alignment with an integrated circuit to be mounted relative to the decoupling capacitor.

The ceramic capacitor is about 0.009 to about 0.010 inch thick, and each connection plate and terminal pin is of about the same thickness. The thickness of films 27, 27' may be about 0.005 inch. Thus, the dimension left available for the insulated housing may be from about 0.010 inch over the assembly. The resulting assembly has the thicker insulated coating (about 0.010 inch per side), reducing chances of inadvertent exposure of conductive elements and increasing reliability of the decoupling capacitor. Also, since the films 27, 27' are insulating (except for the conductive areas contacting the capacitive element), a breach of the outer insulating coast 34 is less likely to result in exposure of conductive surfaces than in the prior art.

The automated manufacturing process of the present invention results in significant economies in manufacturing the decoupling capacitors hereof. In addition, the end product is hermetically sealed and ruggedly constructed, and it is suitable for use with auto-insertion equipment. Thus, the present invention affords substantial advantages both in its manufacturing process and the end product resulting therefrom.

Another feature and advantage of the present invention is that the terminal pins 12 and 14 project from the sides of body 34 at approximately the same height or level even though being electrically connected to opposite faces of capacitor 30. This feature enhances the uniformity and symmetry of the product and may contribute to increased stability in handling during auto-insertion.

The present invention has been discussed in the general configuration of a decoupling capacitor having axial symmetry, with a pair of diagonally opposed active terminal pins and a pair of diagonally opposed stabilizing lugs. However, it will be understood that this configuration is described for purposes of illustration of the preferred configuration for use with an integrated circuit having diagonally opposed power supply pins; but the present invention is not limited to this configuration. The decoupling capacitor of the present invention can be configured as may be dictated by the configuration and requirements of the integrated circuit or other electronic component with which it is to be used. Thus, for example, if the power supply pins of the integrated circuit are not at diagonally opposed locations, the stabilizing lugs will be located at such other locations, as may be dictated by the location of the power supply pins, to balance the power supply pins; and the number of active pins of the decoupling capacitor may be more than two (to match an IC having more than two power leads); and the number and location of stabilizing lugs need not always be symmetrical with respect to the active pins; all of the above being within the general requirement that the active leads and stabilizing lugs be arranged to provide a balanced array of stabilized engagement sites or surfaces for stabilized engagement by the jaws of auto insertion equipment. Also, dummy pins (i.e., pins similar to the active terminal pins but not electrically connected to the capacitive element) may be employed instead of stabilizing lugs.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. The method of making a capacitor, including the steps of:
   removing unwanted material from a strip of electrically conductive material to define a first connection plate and a first terminal pin connected thereto and a second connection plate and a second terminal pin connected thereto;
   forming first and second strips of electrically insulating material with respective first and second areas of electrically conductive material thereon;
   bringing said first and second connection plates and said first strip of insulating material into contact, with said first connection plate being in contact with said first area of conductive material and said second connection plate being spaced from said first area of conductive material;
   placing a capacitor element on said first strip of insulating material, said capacitor element having first and second conductive surfaces, with the first of said conductive surfaces being in contact with said first area of conductive material;
   bringing said second strip of insulating material into contact with said first and second connection plates and with said capacitor element, with said second area of conductive material being in contact with both said second connection plate and with said second conductive surface of said capacitor element, said first connection plate being spaced from said second area of conductive material;
   bonding the above elements to form an assembly with said first conductive surface of said capacitor element and said first connection plate being physically bonded to and in electrical contact with said first conductive area of said first strip of insulating material, and said second conductive surface of said capacitor element and said second conductive plate being physically bonded to and in electrical contact with said second conductive area of said second strip of insulating material; and encapsulating said assembly to enclose and seal all of said assembly other than said first and second terminal pins.

2. The method of claim 1 wherein said step of forming first and second strips of insulating material with conductive areas thereon includes:

defining bands of electrically conductive adhesive on said first and second strips of insulating material.

3. The method of claim 1 wherein said step of forming first and second strips of insulating material with conductive areas therein includes:

coating said first and second strips of insulating material with a nonconductive adhesive; and defining bands of electrically conductive adhesive over said nonconductive adhesive.

4. The method of claim 1 wherein said step of forming first and second strips of insulating material with conductive areas includes:

coating one strip of insulating material with a nonconductive adhesive;

defining bands of electrically insulating adhesive over said nonconductive adhesive; and slitting said one strip of insulating material to form said first and second strips of insulating material.

5. The method of claim 4 including:

forming registration holes in said strip of electrically conductive material;

forming registration holes in said one strip of insulating material prior to slitting said one strip of insulating material;

defining said bands of conductive adhesive at locations offset with respect to successive registration holes in said one strip of insulating material; and reversing one of said first and second strips of insulating material relative to the other whereby the bands of electrically conductive adhesive are offset relative to each other.

6. The method of claim 1 including:

forming registration holes in said strip of electrically conductive material and in said first and second strips of electrically insulating material; and forming said bands of electrically conductive adhesive at offset locations relative to the registration holes in said first and second strips of insulating material.

7. The method of claim 1 including:

positioning said first and second connection plates in positions spaced from said capacitor element.

8. The method of claim 1 wherein:

said first and second terminal pins are connected to edge strips, said terminal pins being severed from said edge strips after the step of encapsulating.

9. The method of claim 8 wherein:

said edge strips are interconnected by transverse webs which cooperate with said edge strips to define a window; and including the step of:

forming alignment holes in said transverse webs.

10. The method of claim 9 including:

forming alignment holes in said strips of electrically insulating material.

11. The method of claim 1 wherein:

said terminal pins are at diagonally opposite locations, and said step of molding includes molding a pair of diagonally opposite stabilizing lugs.

12. The method of making a capacitor, including the steps of:

forming a subassembly of a plurality of capacitor elements by:

(a) removing unwanted material from a strip of electrically conductive material to define a plurality of pairs of first connection plates with first terminal pins connected thereto and a second connection plate with second terminal pins connected thereto, each of said pairs of first and second terminal pins being connected to edge strips;

(b) forming first and second strips of electrically insulating material with a plurality of respective first and second areas of electrically conductive material thereon;

(c) bringing each of said pairs of first and second connection plates and said first strip of insulating material into contact, with each of said first connection plates of each pair being in contact with a respective one of said first areas of conductive material and said second connection plates of each pair being spaced from said first area of conductive material;

(d) placing capacitor elements on each of said areas of conductive material on said first strip of insulating materia, each said capacitor element having first and second conductive surfaces, with the first of said conductive surfaces being in contact with said first area of conductive material;

(e) bringing said second strip of insulating material into contact with said first and second connection plates of each pair of connection plates and with each said capacitor element, with each said second area of conductive material being in contact with both a said second connection plate of each pair and with a second conductive surface of said capacitor element, said first connection plate of each pair being spaced from said second area of conductive material; and (f) bonding the above elements to form a plurality of subassemblies each having said first conductive surface of said capacitor element and said first connection plate physically bonded to and in electrical contact with said first conductive area of said first strip of insulating material, and said second conductive surface of said capacitor element and said second conductive plate physically bonded to and in electrical contact with said second conductive area of said second strip of insulating material;

placing the subassemblies formed in (a) through (f) above in a multi-station mold, with each pair of connection plates and the capacitive element associated therewith and the associated portions of said first and second strips of insulating material with first and second conductive areas constituting an insert for a station in the mold;

introducting a molding material into the mold to encapsulate each insert to enclose and seal each insert other than the first and second terminal pins thereof, and define a plurality of encapsulated capacitor elements;

removing the plurality of encapsulated capacitor elements from the mold; and severing the plurality of encapsulated capacitor elements from said edge strips.

13. The method of claim 12 wherein said step of forming first and second strips of insulating material with conductive areas thereon includes:
defining bands of electrically conductive adhesive on said first and second strips of insulating material.

14. The method of claim 12 wherein said step of forming first and second strips of insulating material with conductive areas therein includes:
coating said first and second strips of insulating material with a nonconducitve adhesive; and
defining bands of electrically conductive adhesive over said nonconductive adhesive.

15. The method of claim 12 wherein said step of forming first and second strips of insulating material with conductive areas includes:
coating one strip of insulating material with a nonconductive adhesive;
defining bands of electrically insulating adhesive over said nonconductive adhesive; and
slitting said one strip of insulating material to form said first and second strips of insulating material.

16. The method of claim 15 including:
forming registration holes in said strip of electrically conductive material;
forming registration holes in said one strip of insulating material prior to slitting said one strip of insulating material;
defining said bands of conductive adhesive at locations offset with respect to successive registration holes in said one strip of insulating material; and
reversing one of said first and second strips of insulating material relative to the other whereby the bands of electrically conductive adhesive are offset relative to each other.

17. The method of claim 12 including:
forming registration holes in said strip of electrically conductive material and in said first and second strips of electrically insulating material; and
forming said bands of electrically conductive adhesive at offset locations relative to the registration holes in said first and second strips of insulating material.

18. The method of claim 12 including:
positioning said first and second connection plates in positions spaced from said capacitor element.

19. The method of claim 12 wherein:
said edge strips are interconnected by transverse webs which cooperate with said edge strips to define a window; and including the step of:
forming alignment holes in said transverse webs.

20. The method of claim 12 including:
forming alignment holes in said strips of electrically insulating material.

21. The method of claim 12 wherein:
said terminal pins are at diagonally opposite locations, and said step of molding includes molding a pair of diagonally opposite stabilizing lugs.

22. A decoupling capacitor including:
a first electrically conductive connection plate;
a second electrically conductive connection plate;
a first terminal pin extending from said first connection plate;
a second terminal pin extending from said second connection plate;
said first and second terminal pins being at different positions relative to the decoupling capacitor;
a capacitive element between said first and second connection plates, said capacitive element having first and second electrically conductive face surfaces;
a first layer of electrically insulating material having a first area of electrically conductive material thereon;
a second layer of electrically insulating material having a second area of electrically conductive material thereon;
said first and second connection plates and said capacitive element being sandwiched between said first and second layers of insulating material with said first connection plate and said first conductive face surface being connected to said first area of electrically conductive material and said second connection plate and said second conductive face surface being connected to said second area of electrically conductive material;
a molded encapsulating cover encapsulating said connection plates and capacitive element, with said terminal pins extending from said encapsulating cover at a first pair of positions; and
a pair of stabilizing elements, said stabilizing elements being at a second pair of positions to balance said terminal pins.

23. The capacitor of claim 22 wherein:
said capacitive element is a ceramic material with a pair of conductive face surfaces.

24. The capacitor of claim 22 wherein:
said capacitive element is mechanically connected to said first and second layers of electrically insulating material and is electrically connected to said connection plates.

25. The capacitor of claim 22 wherein:
said first and second connection plates and said capacitive element are mechanically connected to said first and second layers of electrically insulating material, and the first and second conductive face surfaces of said capacitive element are electrically connected, respectively, to the first and second connection plates through the first and second areas of electrically conductive material.

26. The capacitor of claim 22 wherein:
said stabilizing elements are stabilizing lugs having an exterior contour approximating the exterior contour of at least part of said terminal pins.

27. The capacitor of claim 22 wherein:
said terminal pins are at a first pair of diagonally opposed locations and said stabilizing lugs are at a second pair of diagonally opposed locations.

28. An array of decoupling capacitors positioned between a pair of edge strips from which connection plates and terminal pins of the capacitors are formed, each of said decoupling capacitor having:
a first electrically conductive connection plate;
a second electrically conductive connection plate;
a first terminal pin extending from said first connection plate;
a second terminal pin extending from said second connection plate;
said first and second terminal pins being at different positions relative to the decoupling capacitor;
a capacitive element between said first and second connection plates, said capacitive element having first and second electrically conductive face surfaces;
a first layer of electrically insulating material having a first area of electrically conductive material thereon;

a second layer of electrically insulating material having a second area of electrically conductive material thereon;

said first and second connection plates and said capacitive element being sandwiched between said first and second layers of insulating material with said first connection plate and said first conductive face surface being connected to said first area of electrically conductive material and said second connection plate and said second conductive face surface being connected to said second area of electrically conductive material;

a molded encapsulating cover encapsulating said connection plates and capacitive element, with said terminal pins extending from said encapsulating cover at a first pair of positions; and a pair of stabilizing elements, said stabilizing elements being at a second pair of positions to balance said terminal pins.

29. The capacitor of claim 28 wherein:

said capacitive element is a ceramic material with a pair of conductive face surfaces.

30. The capacitor of claim 28 wherein:

said capacitive element is mechanically connected to said first and second layers of electrically insulating material and is electrically connected to said connection plates.

31. The capacitor of claim 28 wherein:

said first and second connection plates and said capacitive element are mechanically connected to said first and second layers of electrically insulating material, and the first and second conductive face surfaces of said capacitive element are electrically connected, respectively, to the first and second connection plates through the first and second areas of electrically conductive material.

32. The capacitor of claim 28 wherein:

said stabilizing elements are stabilizing lugs having an exterior contour approximating the exterior contour of at least part of said terminal pins.

33. The capacitor of claim 28 wherein:

said terminal pins are at a first pair of diagonally opposed locations and said stabilizing lugs are at a second pair of diagonally opposed locations.

* * * * *